United States Patent [19]

Lerner

[11] 4,158,818

[45] Jun. 19, 1979

[54] SIGNAL PROCESSORS UTILIZING TUNEABLE BANDPASS FILTERS AND TRIGGER CIRCUITS

[75] Inventor: Daniel M. Lerner, Highland Park, N.J.

[73] Assignee: Neptune Eastech, Inc., Edison, N.J.

[21] Appl. No.: 786,251

[22] Filed: Apr. 11, 1977

[51] Int. Cl.² .................................... H04B 15/00
[52] U.S. Cl. ......................... 328/167; 307/229; 307/295
[58] Field of Search .............. 307/230, 233 R, 295, 307/229; 328/139, 162, 163, 165, 167

[56] References Cited

U.S. PATENT DOCUMENTS

| | | | |
|---|---|---|---|
| 3,978,416 | 8/1976 | Sutphin, Jr. | 328/167 |
| 4,032,852 | 6/1977 | Hulls et al. | 328/167 |

Primary Examiner—John Zazworsky

[57] ABSTRACT

Described are several signal processors for measuring the flow rate of fluid. These processors incorporate various combinations of a unique tuneable bandpass filter, which rely on variable rate integration, and unique trigger circuits which trigger on the change of signal slope. Also described are a spectrum analyzer and oscillators which employ the tuneable bandpass filter.

22 Claims, 12 Drawing Figures

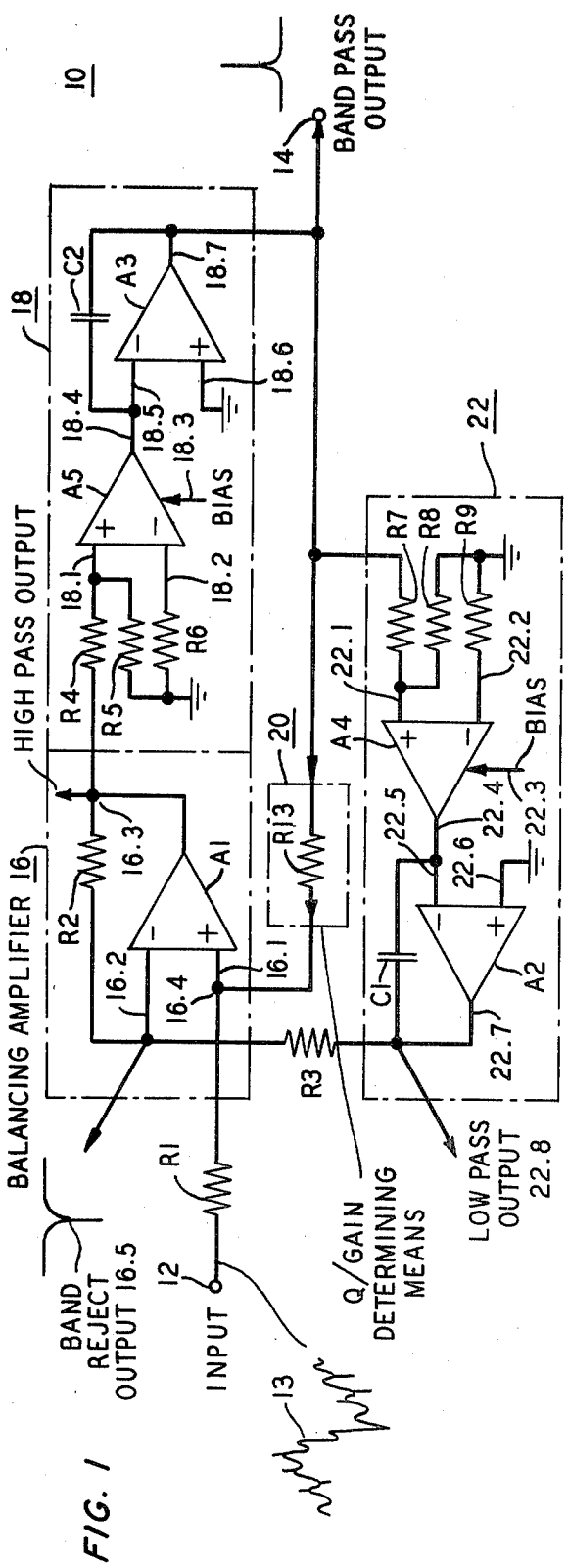
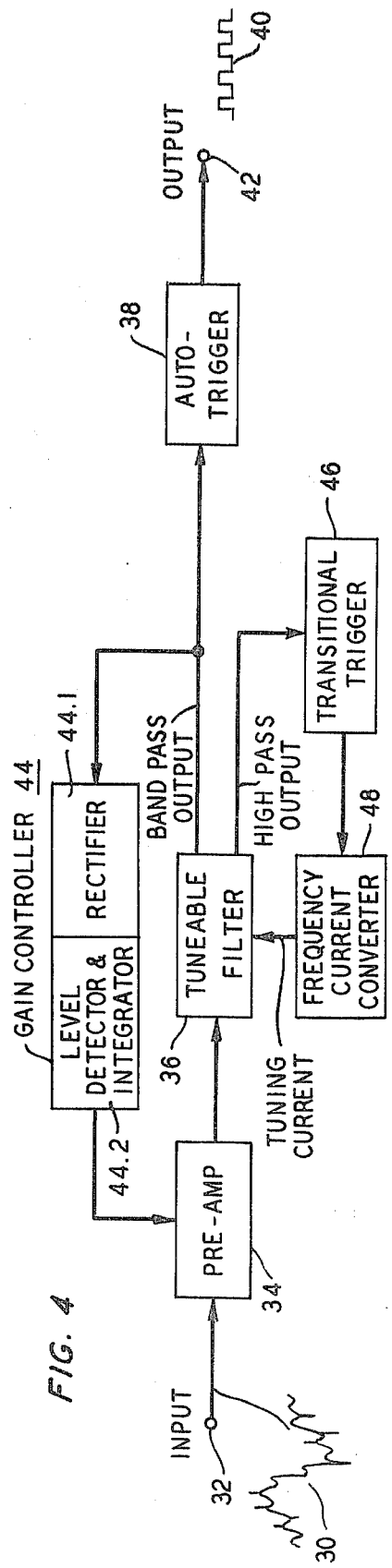
FIG. 1
FIG. 4

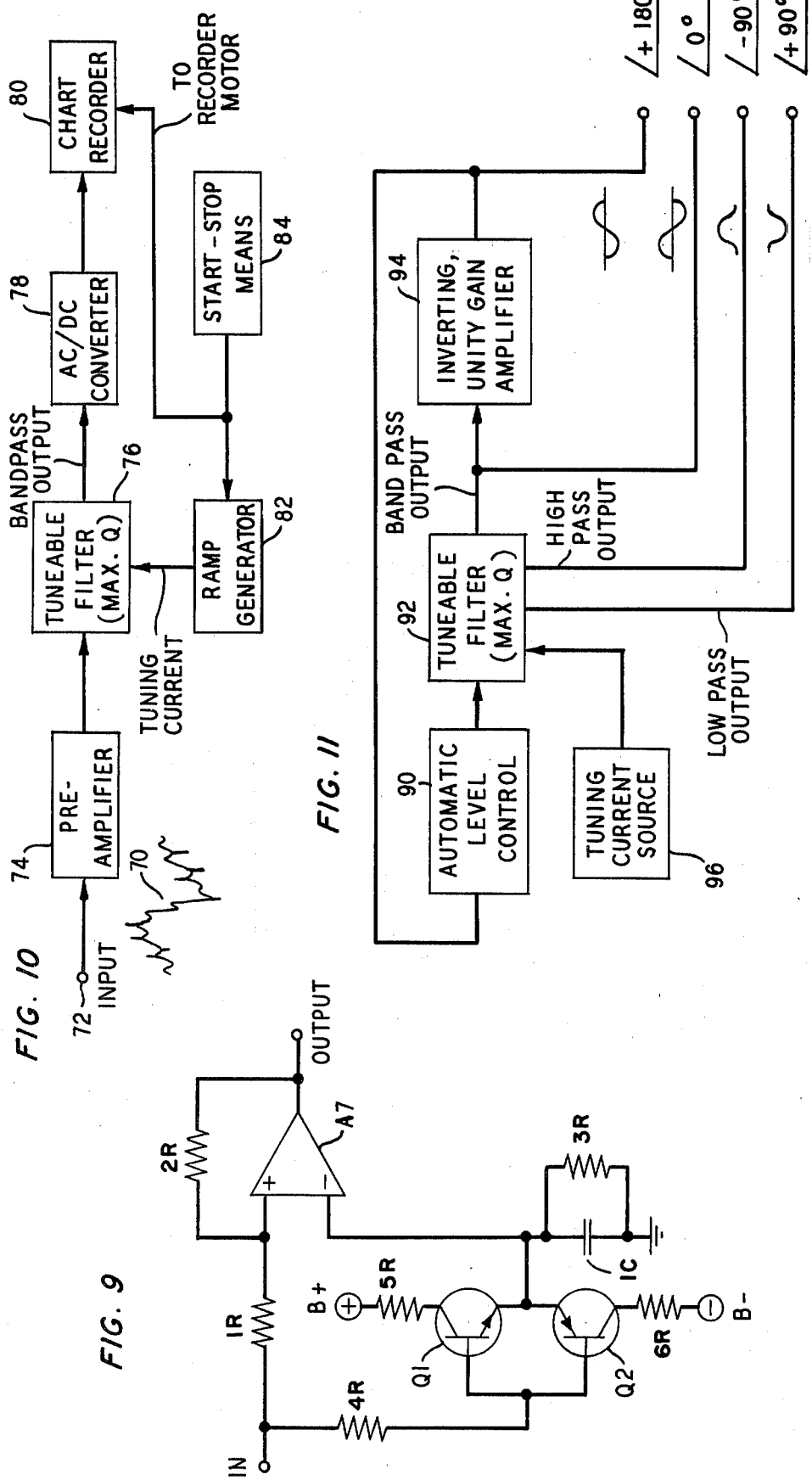

SIGNAL PROCESSORS UTILIZING TUNEABLE BANDPASS FILTERS AND TRIGGER CIRCUITS

BACKGROUND OF THE INVENTION

This invention in one aspect relates to tuneable bandpass filters and, more particularly, to filters for use in a variety of equipments including spectrum analyzers and sine wave oscillators, but principally flow rate signal processors. In other aspects, my invention relates to unique trigger circuits for use in such processors.

In order to measure the flow rate of fluid in a conduit, it is common to utilize a Rodely bluff body to generate vortex shedding as described in U.S. Pat. No. 3,572,117 issued on Mar. 23, 1971, and assigned to the assignee hereof. The vortex shedding, which is oscillatory in nature, is in turn detected by a suitable sensor such as a thermistor, a shuttle or a diaphragm. The detector converts a parameter (e.g., temperature, pressure) variation of the fluid into an electrical signal. Typically, this signal is a composite of a low amplitude, high frequency fluid flow signal superimposed on a higher amplitude, random noise signal of lower frequency. The noise signal is generally not of interest.

Various types of electronic equipment have been proposed by the prior art to process the composite electrical signal and thereby measure flow rate. In many applications the flowmeter has been highly constrained by the high cost of such equipment. One system employs a series combination of a pre-amplifier, a filter and a schmitt trigger. The pre-amplifier incorporates frequency compensation which modifies the effective gain at various frequencies. The gain contouring is specific and is experimentally derived to get the best accuracy from the trigger circuit. Likewise, the signal passes through a fixed bandpass filter, one which has to be specifically designed for each application (e.g., each type of fluid or range of possible flow rates). In this type of equipment the filter bandwidth ($f_{max}:f_{min}$) typically has to be less than 30:1 even for a bluff body-sensor arrangement (meter) which produces high signal quality; and, of course, has to be much narrower for poor signal quality meters. In addition, the equipment has to be adjusted, sometimes critically, to achieve adequate accuracy.

To avoid having to redesign the filter for each different frequency (flow rate) range, the prior art has suggested that a tracking filter be substituted for the fixed bandpass filter. These filters fall into two categories: electrically and mechanically tuneable. Electrically tuneable filters depend on electrically variable components such as light sensitive resistors, FETs (Field Effect Transistors) and voltage variable capacitors as tuning elements. All of these electrical components are notoriously nonlinear and temperature sensitive. In addition, a tuneable filter employing FETs, for example, has two other disadvantages: it is very slow and hence cannot be utilized in most applications which require response to dynamic flow rate changes; and it is very expensive due to the need for matched FETs. A mechanically tuneable filter, on the other hand, is cumbersome, complex and requires sophisticated electronics to interface with the mechanics.

Another development in fluid flow detection is generally referred to as a signal processor and typically has two models, one for measuring liquid flow rates and the other for gas flow. This inherently causes a problem in measuring the flow rate of high pressure gas which has a signal quality between liquid and gas. The basic processor solves the tuning range problem by switching whole sections of circuitry on or off, according to flowrate, but is a precision system, quite complex and difficult to repair.

It is therefore one object of my invention to provide flowmetering equipment which operates over a relatively wide range of signal quality, frequency, signal amplitude and noise conditions.

It is another object of my invention to provide such equipment utilizing a building block approach to circuitry which is simple to repair and modify, and which employs low-cost, non-precision components.

It is yet another object of my invention to provide a unique tuneable bandpass filter for use in such equipment, as well as in other equipments not necessarily related to flowmetering.

It is still another object of my invention to provide a unique trigger circuit for detecting the filter output, especially in flowmetering applications.

SUMMARY OF THE INVENTION

In accordance with one aspect of my invention, a tuneable bandpass filter comprises an input terminal connected to a non-inverting input of a balancing operational amplifier which rejects signal components outside the filter bandpass, a first variable rate integrator connected between the output of the balancing amplifier and an output terminal, Q and gain determining means connected between the output terminal and the non-inverting input of the balancing amplifier, a second variable rate integrator connected between the output terminal and the inverting input of the balancing amplifier and means for varying the rate of integration of the integrators.

In one embodiment of my filter, the variable rate integrators each comprise an operational transconductance amplifier in series with an operational amplifier integrator (i.e., an operational amplifier with a capacitor connected between its output and input). The rate varying means is a current bias applied to the transconductance amplifier.

In another embodiment of my filter, the variable rate integrator comprises an operational transconductance amplifier, a capacitor connected between its output and ground, and a high input impedance follower circuit connected between the output of the transconductance amplifier and the output terminal. Again, the rate varying means is a current bias applied to the transconductance amplifier.

Both of these embodiments possess a number of important advantages: (1) a broad range of frequency tuneability (e.g., 10,000:1), with the relationship between bias current and frequency being linear over the entire range; (2) constant Q over the tuneable range; and (3) self-balancing of the frequency determining components or matching between components.

In a second aspect, my invention is a signal processor for measuring the flow rate of fluid from a composite electronic signal characterized by a high frequency, low amplitude fluid flow signal riding on lower frequency, higher amplitude noise and other medium amplitude random frequency noise. The processor in one embodiment comprises the series combination of a gain controllable pre-amplifier, a tuneable filter as described above, an a.c. coupled summing amplifier and a transitional trigger circuit (to be described hereinafter). Two connections are made between the filter and summing amplifier: one, the bandpass output, to a multiple gain input of the summing amplifier, and the other, a highpass output (at the output of the balancing amplifier of the filter), to a unity gain input of the summing amplifier. The output of the summing amplifier is passed through an a.c. level detector and integrator to the gain controllable pre-amplifier. On the other hand, the output of the transistional trigger, which is also the processor output, is passed through a frequency-to-current converter to the filter (i.e., to the bias control of the variable rate integrators).

In another embodiment of my signal processor, the composite electronic signal is coupled to the series combination of a gain controllable pre-amplifier and a tuneable filter as described above. The bandpass signal of the filter passes through an auto-trigger circuit (to be described hereinafter) to the processor output, and is fed back through an a.c. level detector and integrator to the pre-amplifier; whereas the high pass output of the filter passes through a transitional trigger circuit and a frequency-to-current converter back to the filter (i.e., to the bias control as above).

Third aspects of my invention, therefore, are unique trigger circuits which can be utilized in the foregoing processors. The auto trigger functionally differs from a Schmitt trigger in that the latter switches whenever the input voltage exceeds fixed trigger voltages whereas the former switches whenever the high frequency signal (riding on low frequency noise) changes slope. Structurally, a Schmitt trigger is simply a bistable operational amplifier having a resistor connected between its output and its non-inverting input, which is also resistively coupled to the source of the signal to be processed. A resistor connects the inverting input of the amplifier to ground. In contrast, in an auto-trigger the latter resistor is replaced by a capacitor and a pair of oppositely poled, parallel connected diodes are coupled between the inverting input and the signal source. In comparison, the transistional trigger functions as a Schmitt trigger at low frequencies and as an auto-trigger at high frequencies. It is structurally identical to the auto trigger but for the addition of a resistor in parallel with the capacitor.

A fourth aspect of my invention incorporates the above-described tuneable filter into a low cost, low frequency spectrum analyzer in which the signal to be analyzed is coupled to a pre-amplifier, the output of which passes through the filter to an AC/DC converter. The filter frequency range is swept by a ramp generator and the converter output is displayed on suitable means such as a chart recorder or an x-y recorder.

In accordance with a fifth aspect of my invention, an oscillator comprises a closed loop including the series combination of an automatic level controller, a tuneable filter as above and an inverting, unity gain amplifier. The oscillator is tuned by the current bias applied to the variable rate integrators (range up to 10,000:1). The bandpass output of the filter supplies an oscillator signal at zero degrees phase whereas the amplifier output is at +180 degrees. Signals are also available from the filter at −90° (high pass signal at the output of the balancing amplifier) and at +90° (low pass signal at the inverting input of the balancing amplifier).

BRIEF DESCRIPTION OF THE DRAWING

These and other objects of my invention, together with its various aspects, features and advantages, can be readily understood from the following description taken in conjunction with the accompanying drawing in which:

FIG. 1 is a schematic of a tuneable bandpass filter in accordance with one aspect of my invention;

FIG. 4 is a block-diagram of a signal processor in accordance with another aspect of my invention;

FIG. 9 is a schematic of an alternative embodiment of the transistional trigger of FIG. 8

FIG. 10 is a block-diagram of a spectrum analyzer incorporating my tuneable filter in accordance with a fourth aspect of my invention; and FIG. 11 is a block-diagramatic view of an osciallator incorporating my tuneable filter in accordance with a fifth aspect of my invention.

DETAILED DESCRIPTION

Figure 2:
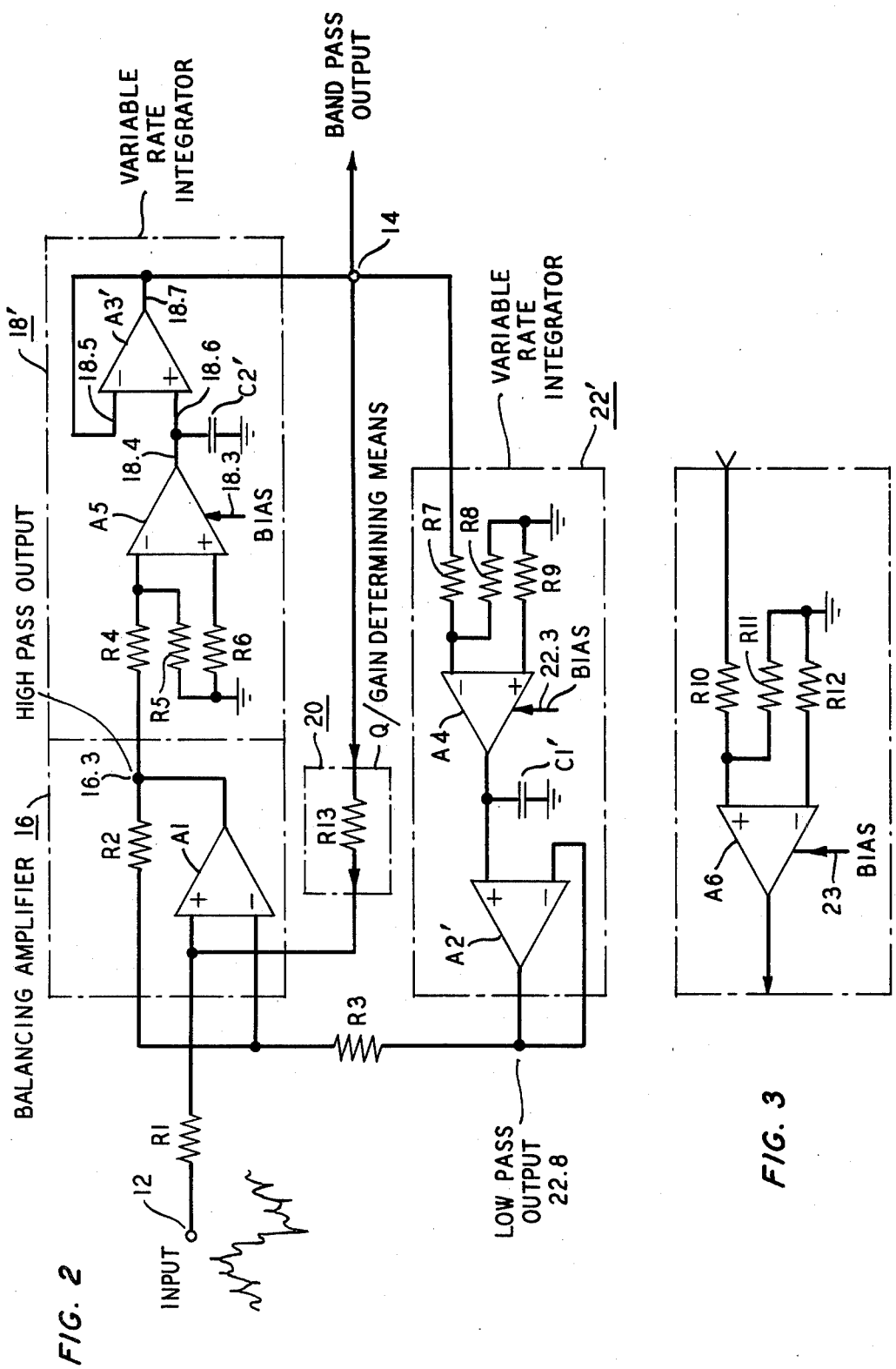
FIG. 2 is a schematic of another embodiment of my tuneable bandpass filter.
Figure 3:
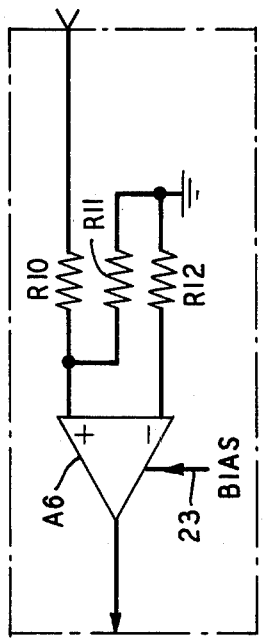
FIG. 3 is a schematic of an alternative Q and gain determining means for use with the filter of either FIG. 1 or FIG. 2.

Tuneable Bandpass Filter (FIGS. 1–3)

With reference now to FIG. 1, there is shown a tuneable bandpass filter 10 comprising input and output terminals 12 and 14, respectively, a balancing (differential) operational amplifier 16 having its non-inverting input 16.1 coupled to input terminal 12, and a first variable rate integrator 18 connected between the output 16.3 of amplifier 16 and output terminal 14. Q and gain determining means 20 is connected between output terminal 14 and the non-inverting input 16.1 of amplifier 16. A second variable rate integrator 22 is connected between output terminal 14 and the inverting input 16.2 of amplifier 16.

More specifically, the signal to be filtered (typically a fluid flow composite electrical signal 13) is coupled through resistor R1 to the input of balancing amplifier 16, i.e., to the non-inverting input 16.1 of operational amplifier A1. Feedback resistor R2 is connected between the inverting input 16.2 and the output 16.3 of A1. The output 16.3 of A1 is coupled to the input of integrator 18; i.e., through resistor R4 to the non-inverting input 18.1 of operational transconductance amplifier A5, which in turn is coupled through resistor R5 to ground. The inverting input 18.2 of A5 is also connected through a resistor R6 to ground. Bias current is supplied to A5 on lead 18.3 to vary the rate of integration of integrator 18. The output 18.4 of A5 is connected to the inverting input 18.5 of operational amplifier A3 whose non-inverting input 18.6 is grounded. Tuning capacitor C2 is connected between the inverting input 18.5 and the output 18.7 of A3, which is itself connected to the filter output terminal 14.

Output terminal 14 is also connected to the input of integrator 22, i.e., through resistor R7 to the non-inverting input 22.1 of operational transconductance amplifier A4, which in turn is coupled through resistor R8 to ground. The inverting input 22.2 of A4 is also connected through resistor R9 to ground. Bias current is supplied to A4 on lead 22.3 to vary the rate of integration of integrator 22. The output of 22.4 of A4 is connected to the inverting input 22.5 of operational amplifier A2 whose non-inverting input 22.6 is grounded. Tuning capacitor C1 is connected between the inverting input 22.5 and the output 22.7 of A2, which is itself connected through resistor R3 to the input of balancing amplifier 16, i.e., to the inverting input 16.2 of A1.

Q and gain determining means 20, illustratively resistor R13, is connected between output terminal 14 and the input of balancing amplifier 16; i.e., to the non-inverting input 16.1 of A1.

From a functional standpoint, A1 is a balancing amplifier which rejects frequency components of the input signal which are outside the bandpass of the filter. To better understand this function, assume that the input frequency $f_{in}=f_c$, is the center frequency of the filter. Then variable rate integrators 18 and 22 pass $f_c$ at a "gain" of $-1$. The highpass output at 16.3 and the lowpass output at 22.8 have equal amplitudes and, if R2=R3, then lead 16.2 is at zero volts (i.e., ground). Because lead 16.2 is grounded, A1 acts as an inverting amplifier in conjunction with integrator 18 yielding a filter gain of $-R13/R1$ at the bandpass peak point. On the other hand, if $f_{in}<f_c$, the integrators 18 and 22 each have "gain" greater than $-1$. Because the signal amplitude at the lowpass point 22.8 is greater than that at the output whereas the signal amplitude at highpass point 16.3 is less than that at the output, a non-zero signal occurs on lead 16.2. A1 subtracts this signal at 16.2 from the input signal at terminal 12. Therefore, a smaller voltage drop occurs across R1 which in turn means a smaller drop across R13 and hence a smaller output signal than at the bandpass peak point. Conversely, if $f_{in}>f_c$, the integrators 18 and 22 have "gain" less than $-1$. Therefore, the signal amplitude at 16.3 is greater than at the output which in turn is less than that at 22.8. Again, a signal appears at 16.2 which, as above, is subtracted from the input signal by A1.

A2 and A3 are integrators, the rate of integration being the determining factor of the bandpass frequency. The integrating capacitors C1 and C2 are, therefore, tuning elements. Preferably these capacitors are identical in value but the circuit will operate with mismatched values as well.

A4 and A5 determine the current supplied to integrators A2 and A3, respectively. That is, the bias current to A4 and A4, along with the voltage difference of their inputs, determines the current to A2 and A3. Since this relationship is linear, the filter operation is linear over the entire tuning range.

Resistor R1 determines the filter input resistance, and, together with R13, determines both filter Q and gain at the center frequency. More specifically, at the center frequency junction 16.4 equals zero impedance. R1 therefore determines the input impedance at center frequency. But, the impedance of junction 16.4 increases rapidly above and below the center frequency. Therefore, the filter input impedance is variable, R1 determining the lowest value. In addition, in accordance with the well known inverting amplifier gain equation, the gain at center frequency is equal to the ratio R13/R1. Empirically, I have found that the Q of the circuit to a first approximation is given by 20 log (R13/R1).

Resistors R2 and R3, on the other hand, are center frequency determining components. One resistor may be used as a variable component to match filters in production. Thus, as with C1 and C2, R2 and R3 are preferably equal, but operation is entirely feasible with mismatched values. A similar comment applies to mismatches between A4 and A5, including their associated resistors. R2 and R3 determine the center frequency $f_c$ by establishing the ratio of the highpass and lowpass voltages at $f_c$. For example, as mentioned previously, with R2=R3, highpass and lowpass voltages are equal at $f_c$. But, if R2=2R3 then the highpass voltage at 16.3 must be one-half of the lowpass voltage at 22.8 to cause zero volts at $f_c$. Unequal values of R2 and R3 must therefore change $f_c$ and the integrators 18 and 22 must have different gains (i.e., other than $-1$) to accommodate the different voltages at the highpass and lowpass outputs. That is, $f_c$ is lowered to cause a "gain" of $+2$ through both integrators in cascade, thereby causing the highpass voltage to be one-half the lowpass voltage at $f_c$. Assuming identical integrators and R2=2R3, each integrator must have a gain of $\sqrt{2}$ at the new center frequency $f_c'$. All else being constant it can be shown that $f_c = f_c' \sqrt{R3/R2}$ where $F_c'$ is the new center frequency and $f_c$ is the center frequency when R2=R3.

Resistive dividers R4–R5 and R7–R8 reduce the signal levels to the linear range of A5 and A4, respectively (typically these amplifiers are linear only for a ±10 mV swing at their inputs). R6 and R9 are input impedance matching resistors.

An alternative embodiment of my tuneable filter is shown in FIG. 2 in which components corresponding to those of FIG. 1 have been given identical reference numbers to facilitate comparison. The basic difference between the two filters resides in variable rate integrators 18' and 22'. In 18', for example, the inputs of A5 are reversed, the output of A5 is connected to the non-inverting input 18.6 of A3' (rather than to the inverting input as in FIG. 1) and C2' is connected between the output 18.4 and ground (rather than between the input and output of A3 as in FIG. 1); and the inverting input 18.5 and output 18.7 of A3' are directly connected (rather than capacitively coupled through C2 as in FIG. 1). In a similar fashion 22' can be related to 22 of FIG. 1.

Functionally, A4 and A5 act as variable rate integrators which integrate voltages onto C1' and C2', respectively. A2' and A3' remove loading effects on the integrators A4 and A5, and can be transistor emitter followers, FET source followers, operational amplifier followers (as shown in FIG. 2), or any other high input impedance follower circuit configuration. The input impedance of the follower determines the quality of the filtering to some extent because of non-ideal integration by A4 and A5.

In applications where variable gain or Q is desired, R13 is replaced, as shown in FIG. 3, with operational transconductance amplifier A6 and input resistors R10, R11, and R12. These resistors are used for the same functions as R4, R5 and R6, i.e., to lower the signal level and to balance the input impedances. As with A4 and A5, the output current of A6 is linearly determined by the differential input voltage times the bias current. The gain is inversely proportional to the bias current and is quite nonlinear, being based on R1 divided by the resistance R(A6) of the circuit of FIG. 3. Since R(A6) is variable, the bias current has a nonlinear control of gain.

By way of example, the following resistor, capacitor and amplifier component values have been found suitable for use in the filter of FIG. 2:

| TABLE OF COMPONENT VALUES | | |
|---|---|---|
| Component | Value | Comment |
| R1 | 560K Ohms | 10K - 10M Ohm suitable. |
| R2,R3 | 100K Ohms | Need not be equal. Range 2:1 to 1:2 suitable. |
| R4,R7 | 20K Ohms | Typical for 2V peak output at filter center frequency. 0-1M Ohm dependent of operating voltage range. |
| R5,R6,R8,R9 | 60 Ohms | Chosen to reduce voltage at inputs of A4 and A5 to 10 mV peak-to-peak. |
| R12 | 3M Ohms | 10K-100M Ohms suitable. |
| C1',C2" | .01 Micro F | 10pf— 100 micro F typically; (low leakage capacitors). |
| A1,A2',A3' | CA3140AT | Manufactured by RCA. CA3130 (RCA) or LM122, 222, 3232 (National Semiconductor Corp., Santa Clara, Calif.) also suitable. |
| A4,A5 | CA3080E | Manufactured by RCA. CA3080A, CA3060 (RCA) also suitable. |
| Circuit Q | 14.5 | Flow signal had frequency jitter, necessitating low Q. Range of 0-60 possible. |
| Gain | 5.3 | Range of 1-1000 possible. |

The tuneable bandpass filters described above have the following notable characteristics (1) wide range tuneability up to 10,000:1, (2) linear tuneability over the entire range with only about 1% deviation; (3) constant Q and gain over the entire tuning range; (4) a direct bandpass output (at terminal 14), a highpass output (at the output of A1, i.e., at 16.3 of FIGS. 1 and 2), a lowpass output (at the output of A2, i.e., at 22.7 of FIGS. 1 and 2), and a band reject output equal to the sum of the highpass and lowpass outputs, all simultaneously tuned to the identical frequency. This feature is employed in the signal processor described hereinafter; (5) for any of the above outputs, low phase distortion of ±90 degrees reference to the phase angle at the center frequency; (6) intrinsically self-balanced circuitry—there is no need for matching or balancing components in production in order to achieve proper Q or gain peak point. More specifically, the frequency-determining components (FIG. 1: A4, A5, C1, C2, R4, R5, R7, R8) are portions of variable integrators. Variations in these components affect the rate of integration but not the quality of integration. That is, because these components affect the center frequency of the filter but not the Q, their total effect can be readily nullified by varying the bias current to A4 and A5. Self-balancing, therefore, means that all frequency-determining components can be lumped together and treated as a net effect on the ratio of the bias current to center frequency of the filter, but no such component need be matched to obtain proper Q; (7) variable gain and Q which follow simple mathematical formulae and can be adjusted via R13 or A6; (8) low cost components; and (9) duplication of components to reduce stock and increase quantity discounts.

Before discussing the several processors which incorporate my tuneable filter, it will be helpful to first describe two trigger circuits which are also utilized in those processors.

Trigger Circuits (FIGS. 6–9)

Figure 6:
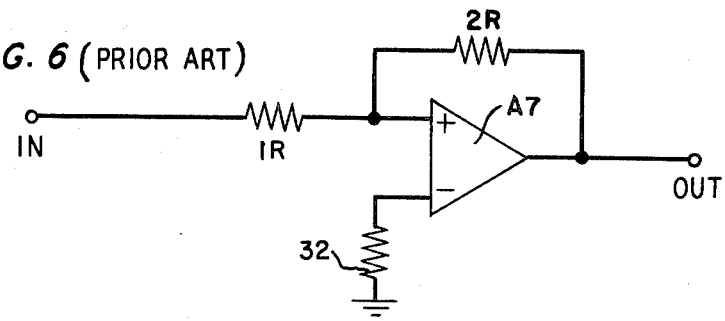
FIG. 6 is a schematic of a prior art Schmitt trigger circuit.
Figure 7:
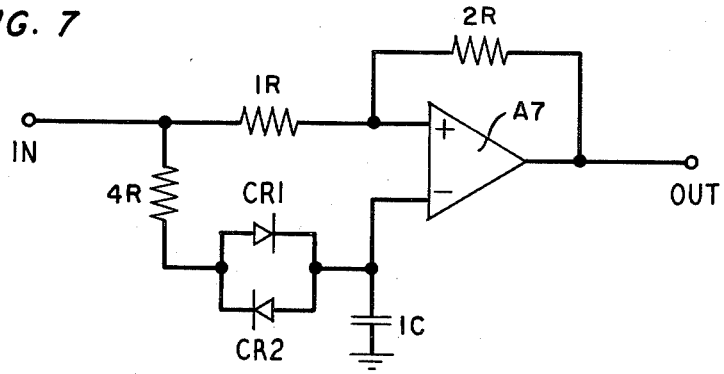
FIG. 7 is a schematic of an auto-trigger circuit in accordance with a third aspect of my invention. This trigger is utilized, for example, in the processor of FIG. 4.

In FIG. 6, a prior art Schmitt trigger circuit is depicted as comprising a bistable operational amplifier A7, a resistor 3R connected between its inverting input and ground, a resistor 2R connected between its non-inverting input and its output, and a resistor 1R connected between its non-inverting input and a source of signals (INPUT). This Schmitt trigger has a fixed baseline and fixed upper and lower threshold (trigger) voltages. Whenever the signal crosses the trigger levels, amplifier A7 toggles and a pulse is produced at the output. But, because the Schmitt trigger ignores signals which do not cross the trigger levels, it would give an erroneous output for a typical composite fluid flow signal, i.e., a high frequency low amplitude fluid flow signal riding on lower frequency, high amplitude noise.

This problem is solved in accordance with another aspect of my invention, the provision of an auto-trigger circuit which has a variable baseline and provides an output pulse whenever the signal changes slope. An auto-trigger which can remove a fluid flow signal from noise greater than the signal itself, is illustratively shown in FIG. 7. It differs from the Schmitt trigger of FIG. 6 in that resistor 3R has been replaced by capacitor 1C, and a pair of oppositely poled parallel connected P-N junction devices (e.g., diodes) CR1 and CR2 are connected in series with resistor 4R and the series combination is connected between the inverting input of A7 and the INPUT. In operation, the baseline is controlled by the voltage on capacitor 1C and follows the signal (less the voltage across the diodes) when the signal is increasing and follows the signal (plus the voltage across the diodes) when the signal is decreasing.

Figure 8:
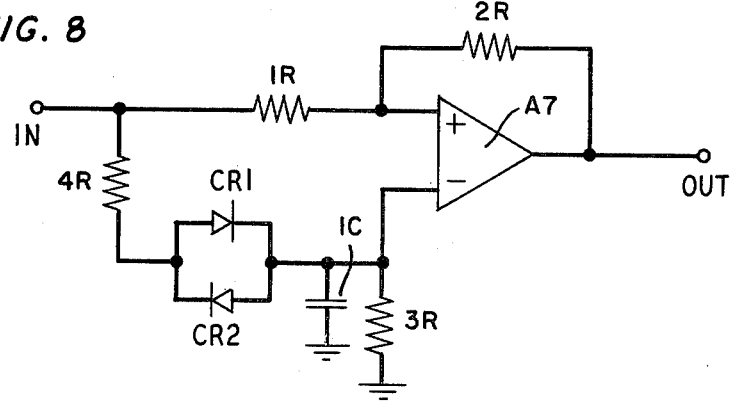
FIG. 8 is a schematic of a transistional trigger circuit in accordance with an alternative embodiment of the auto-trigger of FIG. 7. The transistional trigger is employed in the processors of both FIGS. 4 and 5.

A further modification of the auto-trigger circuit is the transitional trigger circuit shown in FIG. 8. It is a Schmitt trigger at low frequencies and an auto-trigger at high frequencies, with the transition between the two regimes of operation being controlled by an RC time constant. More specifically, the transitional trigger differs from the auto-trigger by the addition of resistor 3R in parallel with capacitor 1C. The transition frequency between Schmitt trigger and auto-trigger operation occurs at approximately $(2\ R3C1)^{-1}$, although there is (desirably) considerable overlap of the two modes of trigger operation in the transitional range.

In both the auto and transitional trigger circuits, the circuit components advantageously have the following characteristics. A7 is a bistable operational amplifier. It should have low bias currents to reduce drift on 1C, and be able to stand a differential input voltage without damage or leakage. 1C is a storage capacitor sufficient to reduce drift due the bias current of A7 to a tolerable level. Resistor 1R and 2R determine the hysteresis of A7. The hysteresis voltage must be less than the diode forward voltage drops. 3R and 1C determine the baseline drift and 4R limits the diode current to safe levels. CR1 and CR2 are illustratively low level signal diodes with low reverse leakage currents.

Alternatively, diodes CR1 and CR2 can be replaced with transistors which, owing to their gain, reduce input loading. As shown in FIG. 9, transistors Q1 and Q2 are complementary and have their emitters connected to the inverting input of A7 and their bases connected to 4R. The collector of Q1 is connected through 5R to a B+ voltage source and the collector of Q2 is connected through 6R to a B− voltage source. Another advantage to using transistors relates to the diminished effect of emitter-base leakage current on the voltage across capacitor 1C because (1) the base currents are smaller than the diode currents and (2) leakage through one base-emitter junction is partially cancelled by emitter to collector leakage in the other transistors.

Figure 9A:
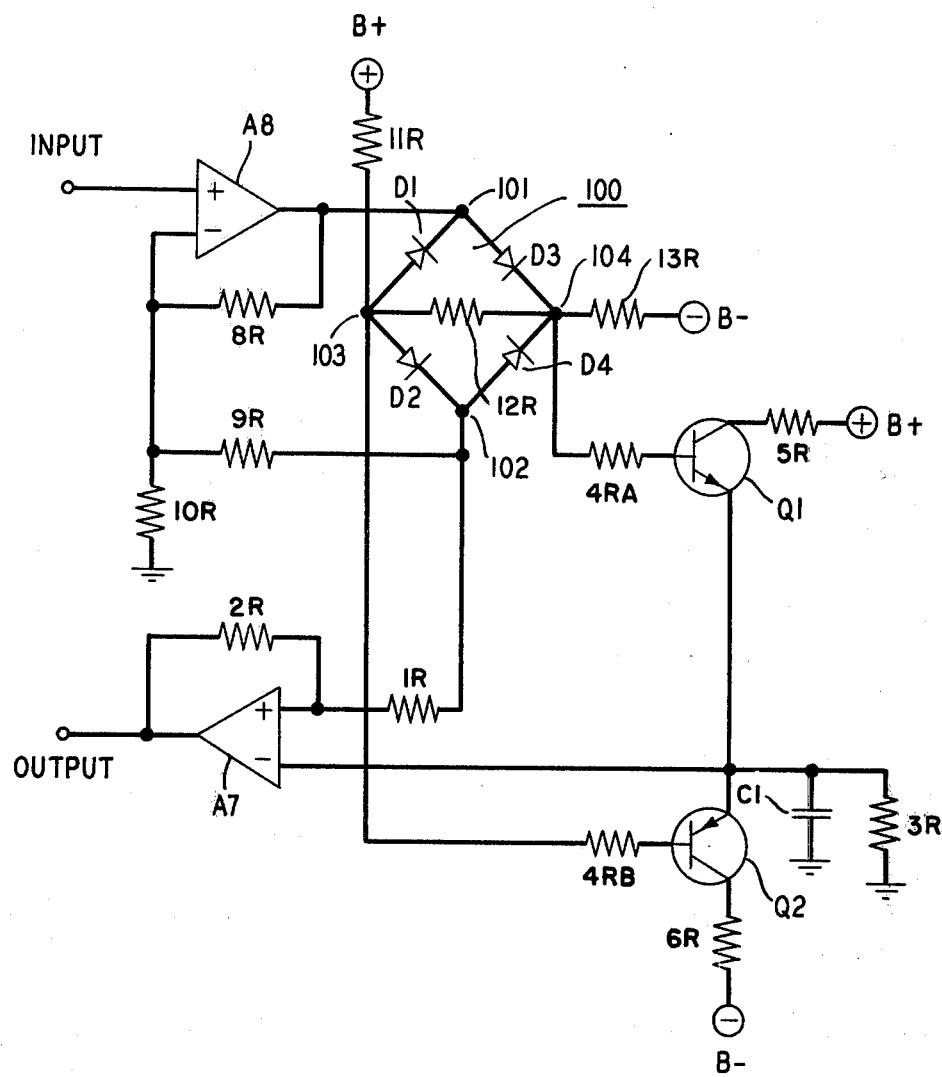
FIG. 9A is a modified form of FIG. 9 adapted to compensate for the base-emitter voltage drop of transistors Q1 and Q2.

In the transitional trigger embodiment of FIG. 9, the Schmitt trigger mode has greater sensitivity than the auto-trigger mode because of the base-emitter voltage drops of Q1 and Q2. However, another embodiment of my transitional trigger shown in FIG. 9A compensates for these voltage drops by the addition of a diode current steering bridge 100 and an operational amplifier A8 between the input and resistor 1R and the bases of Q1 and Q2.

More specifically, the bridge 100 comprises two pairs of opposite terminals 101–102 and 103–104. Terminals 103–104 are connected together by resistor 12R and are connected through resistors 11R and 13R to voltage sources B+ and B−, respectively, and through resistors 4RB and 4RA to the bases Q1 and Q2, respectively. Terminals 101–102 are connected respectively to the output of A8 and to resistor 1R. The diodes are configured as follows: diode D1 connects terminals 103 and 101, D3 connects 101 and 104, D2 connects 103 and 102 and D4 connects 102 and 104, with D1 and D3 being oppositely poled with respect to terminal 101 and D2 and D9 being oppositely poled with respect to terminal 102.

Amplifier A8, on the other hand, has the feedback resistor 8R connected between its output and inverting input. The input to the trigger circuit is applied to the non-inverting input of A8. The inverting input is also connected through resistor 10R to ground and through resistor 9R to terminal 102.

Resistor 11R, 12R and 13R provide a small reverse bias to the emitter-base junctions of Q1 and Q2 to reduce leakage currents. Resistor 8R stabilizes A8 by providing a feedback path around the diode bridge 100. 9R and 10R set the gain of this noninverting configuration. A similar circuit functions in the inverting configuration.

The embodiment of FIG. 9A differs from that of FIG. 9 as follows: (1) the bases of Q1 and Q2 are not connected together and through a single resistor 4R to the input. Instead, the bases are coupled through separate resistors 4RA and 4RB to the resistively connected opposite terminals 103–104 of bridge 100; and (2) resistor 1R is connected to the input through the other pair of terminals 102–101 and A8 instead of directly to the input. Otherwise, Q1–Q2, C1–R3 and A7 function as in the embodiment of FIG. 9.

The implementation of the foregoing trigger circuits and tuneable filters in signal processor arrangements will now be described in accordance with yet another aspect of my invention.

Figure 5:
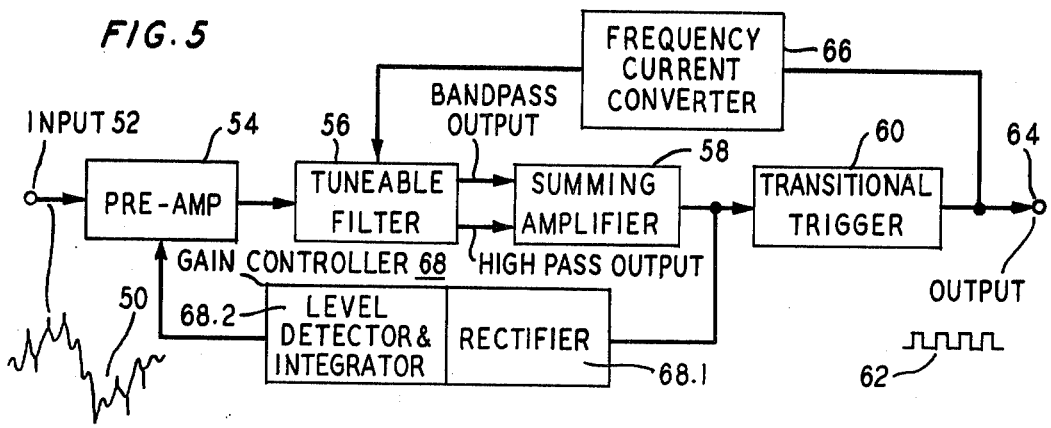
FIG. 5 is a block-diagramatic view of another embodiment of my invention.

Signal Processors (FIGS. 4–5)

One embodiment of my invention, the signal processor of FIG. 4, incorporates both an auto and transitional trigger circuit as well as my tuneable bandpass filter. In particular, a composite fluid flow signal 30 is applied to input terminal 32 and passed through a gain controllable pre-amplifier 34 to tuneable bandpass filter 36 of the type depicted in FIGS. 1 and 2. The bandpass output of filter 36 (i.e., the signal at terminal 14 of FIGS. 1 and 2) is applied to the input of auto trigger 38 (see FIG. 7) which provides a square wave output 40 at output terminal 42. The bandpass output of the filter 36 is also passed through gain controller (GC) 44 back to preamplifier 34. Typically, GC 44 comprises a rectifier 44.1 in series with an AC level detector-integrator 44.2. The output of detector-integrator 44.1 is connected to the gain control input of pre-amplifier 34 and the input of rectifier 44.1 is connected to the bandpass output of filter 36. In addition, the highpass output of filter 36 (i.e., the signal at terminal 16.3 of FIGS. 1 and 2) is applied to the input of transitional trigger 46 (see FIGS. 8 and 9), the square wave output of which is applied to converter 48. The latter converts the frequency of the square wave to a current which is coupled back to tuneable filter 36 (i.e., to bias inputs 18.3 and 22.3 of FIGS. 1 and 2).

In operation, with no signal at input terminal 32, the gain control of pre-amplifier 34 is set at maximum gain by means of controller 44, and filter 36 is tuned to minimum frequency. When signal 30 is applied to input terminal 32, it is amplified by pre-amplifier 34 and fed through the highpass output of filter 36 to transitional trigger 46. The trigger has some "filtering" properties itself, and triggers on the signal being fed into it. The square wave output of the trigger 46 is frequency-to-current converted by converter 48 to generate bias current which controls the center frequency of filter 36.

The highpass output of filter 36 is initially an all pass output because the filter is initially set at its minimum frequency. As filter 36 is tuned upward in frequency, low frequencies are removed from the highpass output, yielding a cleaner signal and, therefore, more accurate tuning.

When the center frequency of filter 36 approaches the actual frequency of signal 30 (i.e., its high frequency component), an output begins to be generated at its bandpass output. This is true flow signal. It is passed through gain controller 44 to provide a gain control current to pre-amplifier 34. More specifically, the AC signal at the bandpass output of filter 36 is full-wave rectified by rectifier 44.1 and fed to the inverting input of integrator-detector 44.2, typically an operational amplifier having a capacitor connected between its output and its inverting input and a reference voltage applied to its non-inverting input. The integrator integrates up and down according to the level of its input signal in relation to the reference voltage. Thus, if the average level of the input signal is below reference, up-integration occurs and conversely. The output voltage of the integrator is converted to a current (via a resistor) which controls the gain of the pre-amplifier 34 (e.g., this current is used as the bias current to an operational transconductance amplifier (not shown) within preamplifier 34).

The flow signal at the bandpass output of filter 36 is also applied to the input of auto-trigger circuit 38 which generates square wave output 40 corresponding to the high frequency fluid flow component of input signal 30. Counting these pulses provides a measure of fluid flow rate.

One comment is in order regarding the use of both types of trigger circuits in the processor of FIG. 4. First, the auto-trigger 38 is used as shown because a DC offset voltage appearing at the bandpass output of filter 36 would render a transitional trigger useless for its Schmitt trigger characteristics. Second, the transitional trigger 46 is used for its Schmitt trigger characteristics at low frequencies (e.g., low flow water) where high frequency noise appears on the basic signal. Under these circumstances, an auto-trigger would trigger on both low frequency signal (e.g. 10 Hz for water flow) and higher frequency noise (e.g., 20 Hz for water flow) and would therefore generate erroneous tuning of the filter 36. In contrast, transitional trigger 46 ignores the higher frequency noise on low frequency signals.

The signal processor of FIG. 4 has a number of unique features: (1) the gain control feedback is derived from the final filtered signal output. Therefore, poor signal quality at input terminal 32 (as might be generated by a poor or defective flowmeter sensor) has virtually no effect upon the output signal level because the gain of pre-amplifier 34 is adjusted to bring the signal of interest to the proper level regardless of noise associated with the flowmeter signal 30: (2) the tuning signal of filter 36 is derived from a partially filtered point (i.e., the high pass output) of filter 36, which improves the tuning signal enough to provide highly accurate filter tuning; and (3) the filter 36 is linearly tuned thereby allowing inexpensive and fast tuning. This feature is especially significant because it eliminates a closed feedback gain control tuning loop configuration dependent on signal amplitude. Instead, the signal processor is essentially independent of signal amplitude. It is basically a measure and set situation, i.e., the frequency is measured and the tuning current is set. In addition, the improved signal quality which occurs after tuning enhanced the measurement of frequency. Consequently, the setting of the filter center frequency is further improved (positive feedback in the tuning loop).

An alternative and somewhat simpler embodiment of my signal processor is shown in FIG. 5. It is simpler in that it incorporates only my tuneable filter and transitional trigger circuit, but no auto trigger circuit. More specifically, a composite fluid flow signal 50 is applied to input terminal 52 and passed through a gain controllable pre-amplifier 54 to tuneable bandpass filter 56 of the type depicted in FIGS. 1 or 2. The bandpass output of filter 56 (i.e., the signal at terminal 14 of FIGS. 1 and 2) as well as its high pass output (i.e., the signal at terminal 16.3 of FIGS. 1 and 2) are applied to the input of a weighted summing amplifier 58. Typically, the high pass signal is connected to a unity gain input of amplifier 58 whereas the bandpass signal is connected to a multiple gain (e.g., 3×) input. The output of summing amplifier 58 is applied to the input of transitional trigger circuit 60 (see FIGS. 8 or 9) which generates square wave signal 62 at output terminal 64. Terminal 64 is also coupled through a frequency-to-current converter 66 to produce a tuning current which varies the center frequency of tuneable filter 56 (i.e., the tuning current is applied to bias inputs 18.3 and 22.3 of FIGS. 1 and 2). In addition, the output of summing amplifier 58 is coupled through gain controller 68 to provide gain control current to pre-amplifier 54.

As with the embodiment of FIG. 4, initially the gain control of pre-amplifier 54 is set at maximum gain by means of controller 68, and filter 56 is tuned to minimum frequency. When flow signal 50 is applied to input terminal 52, it feeds through pre-amplifier 54, the high pass output of filter 56 and the summing amplifier 58 (at unity gain) to the transitional trigger circuit 60. As the trigger circuit 60 responds to the signal and generates square wave 62, it tunes filter 56 upward in frequency (via converter 66). The signal quality improves which enhances tuning accuracy. As the center frequency of filter 56 approaches the actual input frequency of signal 50 (i.e., its high frequency fluid flow component), the input signal starts to emanate from the bandpass output of filter 56. Because the bandpass output has a summed gain of, say, three (3×), the gain controller 68 lowers the bias to pre-amplifier 54 (in response to a larger signal), lowering the output signal level from filter 56 and thereby reducing the effect of the high pass signal.

It is to be understood that the hereinbefore described arrangements are illustrative of the application of the principles of this invention. In light of this teaching, it is apparent that numerous other arrangements may be devised by those skilled in the art without departing from the spirit and scope of my invention. In particular, many functional systems are possible using the four outputs of my tuneable filter: bandpass at terminal 14 of FIGS. 1 or 2, high pass at terminal 16.3, low pass at terminal 22.8, and band reject by summing the highpass and lowpass outputs. In addition, my analysis indicates that at gain less than unity at $f_c$ the bandpass output of my filter should become a band reject output with high Q as the gain at $f_c$ is reduced.

Spectrum Analyzer

One such system shown in FIG. 10 is a low frequency, low cost system analyzer which depends directly on my tuneable bandpass filter for its implementation.

The signal 70 to be analyzed is applied to input terminal 72 and fed through pre-amplifier 74 to the input of tuneable filter 76 of the type depicted in FIGS. 1 and 2. Filter 76 is set at maximum Q and its bandpass output is coupled to an AC-to-DC converter 78. The latter drives a suitable display device such as chart recorder 80 or an x-y recorder (not shown). In order to sweep the input signal, the center frequency of filter 76 is linearly varied by ramp generator 82 which supplies tuning current (i.e., to bias inputs 18.3 and 22.3 of FIGS. 1 and 2). Start-stop means 84 controls both ramp generator 82 and recorder 80 (via its motor, not shown). With filter 76 set at maximum Q, the display on recorder 80 consists of a series of spikes at each frequency corresponding to a frequency component of the input signal. The height of each spike corresponds to the amplitude of the corresponding frequency component. The resolution of the analyzer is determined by the Q of the filter 76, the higher the Q the better the resolution.

Oscillator

My tuneable bandpass filter has a 180 degree phase shift at its center frequency. Consequently, another 180 degree shift can be provided by an inverting amplifier to bring the input into phase with the output and thereby lend my filter to oscillator applications. One such embodiment is shown in FIG. 11.

An automatic level (gain) controller 90, a tuneable bandpass filter 92 of the type shown in FIGS. 1 and 2 and an inverting, unity gain amplifier 94 are connected in series in a closed loop; i.e., the output of controller 90 is coupled to filter 92, the bandpass output of filter 92 drives amplifier 94, and the output of amplifier 94 is fed back to the input of controller 90. Filter 92 is set at maximum Q and tuned by current source 96 (applied to bias inputs 18.3 and 22.3 of FIGS. 1 and 2). Gain controller 90 is an automatic level controlling device which keeps the loop gain at exact unity while oscillating, and increases the loop gain to initiate oscillation.

Sinusoidal signals of the following phases are generated: zero degrees at the bandpass output of filter 92; −90 degrees at its high pass output; +90 degrees at its lowpass output; and −180 degrees at the output of inverting amplifier 94. Source 96 varies the frequency of the sinusoids.

What is claimed is:

1. A tuneable bandpass filter comprising
    an input and an output terminal,
    a first circuit path connected between said terminals,
    said first path including a differential operational amplifier which has a pair of differential inputs and which rejects signals outside the bandpass of said filter and a first variable rate integrator connected in series with one another, said input terminal being coupled to one differential input of said amplifier and said output terminal being coupled to the output of said integrator and providing a bandpass output,
    a second circuit path including a second variable rate integrator having its input coupled to said output terminal and its output coupled to said other differential input of said amplifier,
    Q and gain determining means coupled between said output terminal and said one input of said amplifier, and
    control means for varying the rate of integration of said integrators, thereby to tune the center frequency of said filter,
    said operational amplifier comprises an output high pass terminal, and
    said control means comprises
    a transitional trigger responsive to signals on said output high pass terminal for generating pulse signals related to the frequency of said signals on said high pass terminal and
    a converter for converting the frequency of said pulse signals to current signals for varying the rate of integration of said first and second integrators to tune the center frequency of said filter.

2. The filter of claim 1 wherein said first variable rate integrator comprises:
    a first transconductance operational amplifier having a bias control connected to said control means for varying the current generated at its output, the output of said differential amplifier being coupled to the input of said transconductance amplifier,
    a first integrator operational amplifier having its input coupled to the output of said transconductance amplifier and its output coupled to said output terminal, and
    a first capacitor connected to the output of said transconductance amplifier; and
    said second variable rate integrator comprises:
    a second transconductance operational amplifier having a bias control connected to said control means for varying the current at its output, said output terminal being coupled to an input of said second transconductance amplifier,
    a second integrator operational amplifier having its input coupled to the output of said second transconductance amplifier and its output coupled to said other input of said differential operational amplifier, and
    a second capacitor connected to the output of said second transconductance amplifier.

3. The filter of claim 2 wherein said first capacitor is also connected between the input and output of said first integrator operational amplifier and said second capacitor is also connected between the input and output of said second integrator operational amplifier.

4. The filter of claim 1 wherein said Q and gain determining means comprises a resistor connected from said one input of said differential operational amplifier to said output terminal.

5. The filter of claim 1 wherein said Q and gain determining means comprises a transconductance operational amplifier having a bias control and having its input coupled to said output terminal and its output coupled to said one input of said differential amplifier, and means for supplying variable current to said bias control, thereby to vary the Q and gain of said filter.

6. The filter of claim 1 further including a resistor connected between said other input terminal of said differential amplifier and the output of said second variable rate integrator.

7. The filter of claim 1 further comprising
    a gain controllable pre-amplifier connected in series between said input terminal and said one input of said differential operational amplifier and
    a gain controller responsive to signals on said output terminal for supplying a gain control signal to said pre-amplifier and said controller comprising
    means for rectifying said signals on said output terminal and
    means for integrating the rectified signals on said output terminal up and/or down relative to a predetermined level, thereby to generate said gain control signal.

8. The filter of claim 1 wherein said output terminal is a bandpass output terminal and
    further comprising an auto-trigger circuit responsive to signals on said bandpass terminal for producing output square wave signals.

9. The filter of claim 8 wherein
    said auto-trigger comprises
    an input terminus and an output terminus,
    a bistable operational amplifier having a pair of inputs, and having an output connected to said output terminus,
    a first resistor connected between said output and one of said inputs of said bistable operational amplifier,
    a second resistor connected between said input terminus and said one input of said bistable operational amplifier,
    a capacitor connected between the other input of said bistable operational amplifier and a source of reference potential, and
    a pair of oppositely poled, parallel connected p-n junction devices coupled between said input terminus and said other input of said bistable operational amplifier.

10. The filter of claim 1 wherein said first variable rate integrator comprises:
    a first variable rate integrator operational amplifier having a bias control connected to said control means for varying the current generated at its output, the output of said differential amplifier being coupled to the input of said integrator operational amplifier,
    a first high impedance follower operational amplifier having its input coupled to the output of said integrator operational amplifier and its output coupled to said output terminal, and
    a first capacitor connected between the output of said integrator operational amplifier and a source of reference potential; and
    said second variable rate integrator comprises:

a second variable rate integrator operational amplifier having a bias control connected to said control means for varying the current at its output, said output terminal being coupled to an input of said second variable rate integrator operational amplifier, a second high impedance follower operational amplifier having its input coupled to the output of said second variable rate integrator operational amplifier and its output coupled to said other input of said differential operational amplifier, and a second capacitor connected between the output of said second variable rate integrator operational amplifier and said source of reference potential.

11. A tuneable bandpass filter for separating a high frequency, low amplitude fluid flow signal from relatively lower frequency, higher amplitude noise comprising:

an input terminal and an output bandpass terminal, first and second circuit paths connected between said terminals, said first path including (i) a differential operational amplifier which rejects signals outside the bandpass of said filter, said differential amplifier having an inverting input and a non-inverting input, and a high pass output, (ii) a first variable rate integrator connected in series with said differential amplifier, the output of said integrator being coupled to said output terminal, and (iii) a first resistor connected between said input terminal and said non-inverting input of said differential amplifier, said second path includes (i) a second variable rate integrator having its input connected to said output terminal and (ii) a second resistor connected between the output of said second integrator and said inverting input of said differential amplifier, a Q and gain determining resistor connected between said output terminal and said non-inverting input of said differential amplifier, and control means coupled to said high pass output of said differential amplifier and responsive to said high frequency signal therefrom for varying the rate of integration of said integrators, thereby to tune the center frequency of said filter.

12. The filter of claim 11 wherein:

said differential amplifier includes a feedback resistor connected between its inverting input and its output, each of said integrators includes a transconductance operational amplifier and a second operational amplifier in series with one another, each of said latter amplifiers also having inverting and non-inverting inputs and said transconductance amplifier having a bias control, a resistive divider connected between the inputs of said transconductance amplifier and to a source of reference potential to reduce the signal level thereat to within its linear range of operation, the output of said transconductance amplifier being connected to the inverting input of said second amplifier, and a capacitor connected between the inverting input and the output of said second amplifier, the non-inverting input of said second amplifier being connected to said source of reference potential, and said control means supplies variable current to said bias control of each of said transconductance operational amplifiers, thereby to vary the current supplied to each of said second amplifiers.

13. The filter of claim 11 wherein:

said differential amplifier includes a feedback resistor connected between its inverting input and its output, each of said integrators includes a transconductance amplifier and a second operational amplifier in series with one another, each of said latter amplifiers also having inverting and non-inverting inputs and said transconductance amplifier having a bias control, a resistive divider connected between the inputs of said transconductance amplifier and to a source of reference potential to reduce the signal level thereat to within its linear range of operation, the output of said transconductance amplifier being connected to the non-inverting input of said second amplifier, and a capacitor connected between said non-inverting input and said source of reference potential, said inverting input and output of said second amplifier being directly connected together to form a high impedance follower circuit, and said control means supplies variable current to said bias control of each of said transconductance amplifiers, thereby to vary the current supplied to each of said capacitors.

14. A filter arrangement for a composite signal having a high frequency, low amplitude component riding on a relatively lower frequency, higher amplitude component, comprising:

an input terminal to which said composite signal is applied, an output terminal at which a square wave signal is generated, a gain controllable pre-amplifier, a tuneable bandpass filter and an auto-trigger circuit connected in series between said terminals, said filter having a bandpass output coupled to the input of said auto-trigger circuit and a highpass output, a gain controller responsive to said bandpass output for supplying a gain control signal to said preamplifier, a transitional trigger circuit for generating a second square wave signal related to the frequency of said highpass output, and a converter for converting the frequency of said second square wave to a current signal for tuning the center frequency of said filter.

15. The arrangement of claim 14 wherein said gain controller comprises means for rectifying said bandpass output and means for integrating the rectified bandpass output up and/or down relative to a predetermined level, thereby to generate said gain control signal.

16. The arrangement of claim 15 wherein:

(a) said tuneable bandpass filter comprises an input and an output terminal, a first circuit path connected between said terminals, said first path including a differential operational amplifier which has a pair of inputs and which rejects signals outside the bandpass of said filter, and a first variable rate integrator connected in series with one another, said input terminal is coupled to one input of said amplifier and said output terminal is coupled to the output of said integrator, a second circuit path including a second variable rate integrator having its input coupled to said output terminal and its output coupled to the other input of said amplifier, Q and gain determining means coupled between said output terminal and said one input of said amplifier, and control means for varying the rate of integration of said integrators, thereby to tune the center frequency of each filter, the output of said differential amplifier having the high pass signal coupled to the input of said transitional trigger and the signal at said output terminal of said filter being the bandpass signal coupled to the input of said auto-trigger circuit, (b) said auto-trigger circuit comprises an input and an output terminal, a bistable operational amplifier having a pair of inputs, and having an output coupled to said output terminal, a first resistor connected between said output and one input of said operational amplifier, a second resistor connected between said input terminal and said one input of said operational amplifier, a capacitor connected between the other input of said operational amplifier and a source of reference potential, and a pair of oppositely poled, parallel connected p-n junction devices coupled between said input terminal and said other input of said operational amplifier; and (c) said transitional trigger circuit comprises said auto-trigger circuit in combination with a third resistor connected in parallel with said capacitor.

17. A filter arrangement for a composite signal having a high frequency, low amplitude component riding on a relatively lower frequency, high amplitude component, comprising:

an input terminal to which said composite signal is applied, an output terminal at which a square wave signal is generated, a gain controllable pre-amplifier, a tuneable bandpass filter, a summing amplifier and a transitional trigger circuit connected in series between said terminals, said filter having a bandpass and a highpass output, said summing amplifier having a unity gain input coupled to said high pass output and a multiple gain input coupled to said bandpass output, a converter for converting the frequency of said square wave signal to a current signal for tuning the center frequency of said filter, and a gain controller responsive to the output of said summing amplifier for supplying a gain control signal to said pre-amplifier.

18. The arrangement of claim 17 wherein said gain controller comprises means for rectifying the output of said summing amplifier and means for integrating the rectified output up and/or down relative to a predetermined level, thereby to generate said gain control signal.

19. The arrangement of claim 18 wherein:

(a) said tuneable bandpass filter comprises an input and an output terminal, a first circuit path connected between said terminals, said first path including a differential operational amplifier which has a pair of inputs and which rejects signals outside the bandpass of said filter and a first variable rate integrator connected in series with one another, said input terminal being coupled to one input of said amplifier and said output terminal being coupled to the output of said integrator, a second circuit path including a second variable rate integrator having its input coupled to said output terminal and its output coupled to the other input of said amplifier, Q and gain determining means coupled between said output terminal and said one input of said amplifier, and control means for varying the rate of integration of said integrators, thereby to tune the center frequency of said filter, the output of said differential amplifier being the high pass signal and the signal at said output terminal of said filter being the bandpass signal, both of which are coupled to the inputs of said summing amplifier, (b) said transitional trigger circuit comprises an input and an output terminal, a bistable operational amplifier having a pair of inputs and having an output coupled to said output terminal, a first resistor connected between said output and one input of said operational amplifier, a second resistor connected between said input terminal and said one input of said operational amplifier, the parallel combination of a third resistor and a capacitor is connected between the other input of said operational amplifier and a source of reference potential, and a pair of oppositely poled, parallel connected p-n junction devices are coupled between said input terminal and said other input of said operational amplifier.

20. A tuneable bandpass filter comprising an input and an output terminal, a first circuit path connected between said terminals, said first path including a differential operational amplifier which has a pair of differential inputs and which rejects signals outside the bandpass of said filter and a first variable rate integrator connected in series with one another, said input terminal being coupled to one differential input of said amplifier and said output terminal being coupled to the output of said integrator and providing a bandpass output, a second circuit path including a second variable rate integrator having its input coupled to said output terminal and its output coupled to said other differential input of said amplifier, Q and gain determining means coupled between said output terminal and said one input of said amplifier, control means operable for varying the rate of integration of said integrators, thereby to tune the center frequency of said filter, a filter high pass output terminal, and means including a summing amplifier responsive to signals on said high pass output terminal and said bandpass output terminal for generating an output summed signal for controlling the operation of said control means for varying said rate of integration of said integrators and thereby producing a bandpass signal at said bandpass output terminal with the tuned center frequency.

21. The filter of claim 20 further comprising:

a signal input terminal, a gain controllable pre-amplifier connected in series with said signal input terminal and said one input of said differential operational amplifier, a gain controller responsive to said output summed signal for supplying a gain control signal to said pre-amplifier, and said gain controller comprising means for rectifying said output summed signal, and means for integrating the rectified output summed signal up and/or down relative to a predetermined level, thereby to generate said gain control signal.

22. The filter of claim 20 wherein said means including said summing amplifier comprises a transitional trigger circuit responsive to said output summed signal for generating pulse signals on said output terminal, and wherein said control means comprises a converter for converting the frequency of said pulse signals on said output terminal to a current signal for varying the rate of integration of said first and second integrators to tune the center frequency of said filter.

* * * * *